US009438229B2

(12) United States Patent
Späh

(10) Patent No.: US 9,438,229 B2
(45) Date of Patent: Sep. 6, 2016

(54) CONFIGURABLE INTERFACE CIRCUIT
(71) Applicant: Diehl Aerospace GmbH, Überlingen (DE)
(72) Inventor: Jürgen Späh, Überlingen (DE)
(73) Assignee: Diehl Aerospace GmbH, Überlingen (DE)
(*) Notice: Subject to any disclaimer, the term of this patent is extended or adjusted under 35 U.S.C. 154(b) by 90 days.
(21) Appl. No.: 14/565,930
(22) Filed: Dec. 10, 2014
(65) Prior Publication Data
US 2015/0162907 A1 Jun. 11, 2015
(30) Foreign Application Priority Data Dec. 11, 2013 (DE) .................... 10 2013 020 803
Aug. 22, 2014 (DE) .................... 10 2014 012 660

(51) Int. Cl.
H03K 3/00 (2006.01)
H03K 17/687 (2006.01)
H02M 1/38 (2007.01)
H03K 19/0175 (2006.01)
H03K 19/173 (2006.01)
(52) U.S. Cl.
CPC .......... *H03K 17/6871* (2013.01); *H02M 1/38* (2013.01); *H03K 19/01759* (2013.01); *H03K 19/017581* (2013.01); *H03K 19/1733* (2013.01); *H03K 2217/0036* (2013.01)
(58) Field of Classification Search
None
See application file for complete search history.

(56) References Cited

U.S. PATENT DOCUMENTS

| 6,727,726 | B1* | 4/2004 | Plants | H03K 19/17728 326/38 |
| 6,751,723 | B1* | 6/2004 | Kundu | G06F 15/7867 712/10 |
| 6,867,615 | B1* | 3/2005 | Plants | H03K 19/1776 326/40 |
| 7,199,609 | B1* | 4/2007 | Plants | H03K 19/17744 326/40 |
| 7,385,419 | B1* | 6/2008 | Plants | H03K 19/17744 326/40 |
| 8,179,161 | B1* | 5/2012 | Williams | H03K 19/01759 326/82 |
| 2008/0130339 | A1* | 6/2008 | McDonald | H02M 7/217 363/127 |
| 2008/0232141 | A1* | 9/2008 | Artusi | H02M 1/4225 363/21.01 |
| 2010/0157638 | A1* | 6/2010 | Naiknaware | H02M 7/4807 363/131 |
| 2010/0165667 | A1* | 7/2010 | Artusi | H02M 1/4225 363/21.01 |

(Continued)

FOREIGN PATENT DOCUMENTS

EP 0 620 510 A1 10/1994

*Primary Examiner* — Lincoln Donovan
*Assistant Examiner* — Khareem E Almo
(74) *Attorney, Agent, or Firm* — Scully Scott Murphy and Presser; Frank Digiglio

(57) ABSTRACT

The present invention relates to an interface circuit for intermediate connection between a logic circuit and a power circuit, having a supply connection for connection to a power supply, contains two logic connections, which are configurable as logic input or logic output, and two power connections, which are configurable as power input or power output, and a configuration unit for the corresponding configuration, wherein the power input can be read by the logic output and the power output can be driven by the logic input.
The present invention further relates to an interface module, having at least two power connections, contains at least one interface circuit, the power connections of which interface circuit are routed to the power connections of the interface module.

10 Claims, 8 Drawing Sheets

(56) References Cited

U.S. PATENT DOCUMENTS

| | | | | |
|---|---|---|---|---|
| 2010/0244775 A1* | 9/2010 | Smith | H02M 3/33584 | 320/140 |
| 2012/0074949 A1* | 3/2012 | Kepley | H02M 3/33584 | 324/426 |
| 2012/0281444 A1* | 11/2012 | Dent | H02M 1/32 | 363/56.01 |
| 2013/0088078 A1* | 4/2013 | Shteynberg | H05B 33/0815 | 307/31 |
| 2014/0009980 A1* | 1/2014 | Divan | H02M 5/4585 | 363/37 |
| 2014/0021893 A1* | 1/2014 | Komatsu | H02H 3/08 | 318/400.22 |
| 2014/0307495 A1* | 10/2014 | Fukuta | H02H 3/08 | 363/98 |
| 2015/0162907 A1* | 6/2015 | Spah | H03K 19/01759 | 327/424 |
| 2015/0280555 A1* | 10/2015 | Koertzen | H02M 3/156 | 713/300 |
| 2015/0381057 A1* | 12/2015 | Luu | H02M 7/5387 | 363/21.01 |
| 2016/0007417 A1* | 1/2016 | Gao | H05B 33/0815 | 315/219 |
| 2016/0028388 A1* | 1/2016 | Kim | H03K 7/06 | 327/114 |
| 2016/0043706 A1* | 2/2016 | Elkin | H03K 3/35625 | 327/202 |
| 2016/0099651 A1* | 4/2016 | Ishigaki | H02M 3/3546 | 363/21.05 |
| 2016/0111961 A1* | 4/2016 | Balakrishnan | H02M 3/33523 | 363/21.12 |

* cited by examiner

Fig. 4

| CVHB_CONFIG | DSO_28VOPN | DSO_GNDOPN | SWITCH | MOTOR_STEPPER | MOTOR_BLDC | MOTOR_BDC | DSI_28VOPN | DSI_GNDOPN | AI_(0V..32V)_PxH | AI_(0V..32V)_PxL | Comment |
|---|---|---|---|---|---|---|---|---|---|---|---|
| 1 | x | | | | | | | | | | |
| 2 | x | x | | | | | | | | | |
| 3 | x | | x | | | | | | | | Inhibition-SW or signal routing |
| 4 | x | | | | | | | | | | |
| 5 | x | | | | | | | | | x | |
| 6 | | x | | | | | | | | | |
| 7 | | x | | | | | | | | | |
| 8 | | x | x | | | | | | | | Inhibition-SW or signal routing |
| 9 | | x | | | | | | | x | | |
| 10 | | | x | | | | | | | | |
| 11 | | | | x | | | | | | | in combination with other CVHB's |
| 12 | | | | | x | | | | | | in combination with other CVHB's |
| 13 | | | | | | x | | | | | in combination with other CVHB's |
| 14 | | | | | | | x | x | x | | |
| 15 | | | | | | | x | | | | |
| 16 | | | | | | | | x | x | x | |
| 17 | | | | | | | | | x | x | |

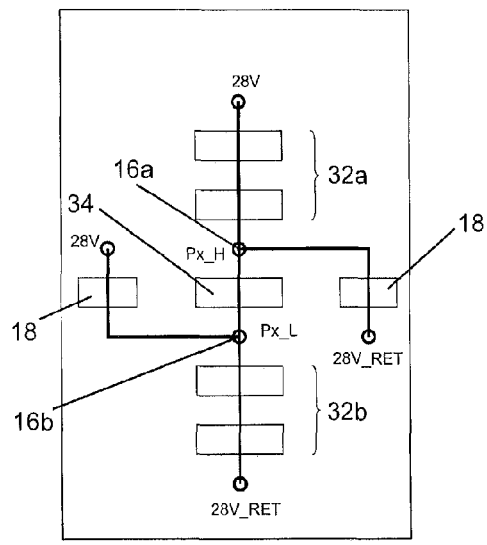
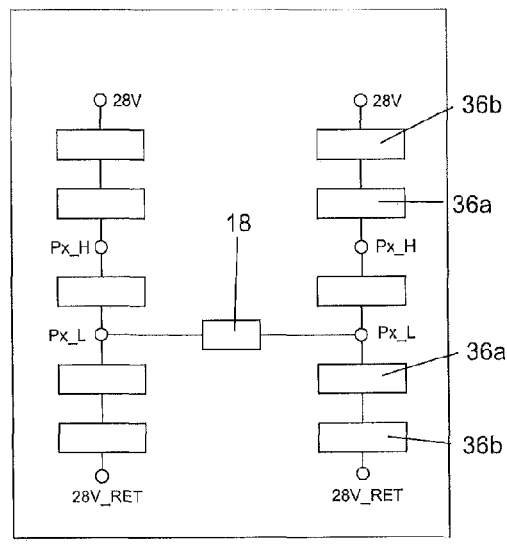
Fig. 5A
Fig. 5B
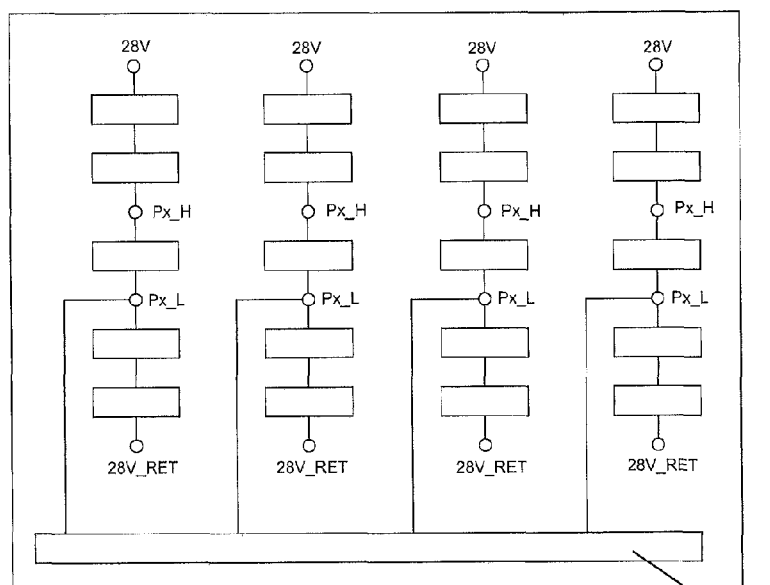
Fig. 5C

CONFIGURABLE INTERFACE CIRCUIT

BACKGROUND OF THE INVENTION

The invention relates to an interface circuit—also referred to as interface—between a logic circuit (logic part of an electrical circuit) and a power circuit (power part of the circuit), in particular for use in an aircraft. The power part of the circuit is, for example, a load to be driven, for example a motor, which is then connected to a power output of the interface. Alternatively, it is an electrical element to be read, for example a switch the switch state of which is to be detected or a current conductor the current flow of which is to be measured, said electrical element then being connected to a power input of the interface. The interface is generally connected to a power supply in order to mutually transform logic signals, which are weak in terms of power, and load signals, which are intensive in terms of power.

DISCUSSION OF THE PRIOR ART

It is known to use specific DSO (discrete output) interfaces for the output functionality and to use specific DSI (discrete input) interfaces for the input functionality. DSO interfaces in the form of a half-bridge with semiconductor switches are known. The half-bridge is driven by the logic part. The centre connection of the half-bridge forms the power output for the wiring of the power part. The power supply is connected to the upper or lower ends of the half-bridge (supply connection).

It is also known to combine a plurality of interfaces into an interface module. The interface module then has a particular number, for example three, of power outputs, which exclusively have an output function, and a particular number, for example two, of power inputs, which exclusively have an input function. A specific DSO interface is assigned to each of the power outputs and a specific DSI interface is assigned to each of the power inputs. Such modules are often used in systems such that at least one of the connections remains unused. This is disadvantageous, for example for reasons of cost, resources, space and weight.

It is known from EP 0 620 510 A1 to design an interface for sending and/or receiving digital signals to be configurable. For this purpose, an Application-Specific Integrated Circuit (ASIC) is replaced by the combination of a universal microcontroller and a Field Programmable Gate Array (FPGA) or a comparable circuit. Such an interface is not suitable for power parts operating using analog or those with high power, for instance motors or the like.

SUMMARY OF THE INVENTION

The present invention provides an improved interface circuit and an improved interface module.

The interface circuit is used for intermediate connection between a logic circuit and a power circuit. The interface circuit has a supply connection for connecting to a power supply. The interface circuit contains two logic connections. Each of the logic connections is used to connect to a respective logic circuit. Each of the logic connections is either configurable as logic input or as logic output. In addition, the interface has two power connections. Each of the power connections is used in each case to connect to a power circuit. Each of the power connections is either configurable as power input or as power output. The interface circuit has a configuration unit, which is used to configure the logic connections and the power connections.

In the case of the interface circuit, each of the power inputs can be read by one of the logic outputs and each of the power outputs can be driven by one of the logic inputs.

The described interface circuit represents a minimal embodiment in terms of the number of logic and power connections. Further supply, logic or power connections of the above type mentioned in the sense of the invention may be present.

The interface circuit offers the advantage that two power connections are present, which are configurable as power input or power output according to requirements and hence can be driven or read. Hence, by using a sufficient number of identical interface circuits according to the invention, precisely enough interfaces can be provided in an electrical system that the total number of inputs and outputs is covered. If necessary, a single power connection remains unused. This results in a reduction in the total number of interfaces on the system plane by virtue of the different use possibilities of the interface circuit which is versatile, that is to say useable in a versatile manner, and configurable. Thus, the interface resources are almost completely or completely utilized. Since an unused interface is present, if necessary, the space and weight requirement reduces, which is of great advantage in particular in aircraft technology, and hence also the costs for the system-wide interfaces. The interface circuit which can be used in a versatile manner or is configurable according to requirements is therefore used to drive loads or motors and to detect digital and analog signals. By virtue of the configurability, various functionalities can be realized as well as various ranges of values of generated or detected electrical variables.

By virtue of the configurability of the power connections, a desired functionality can be switched on any of the connections, which ensures a so-called "switch functionality". In other words, signal routing within the interface circuit is possible.

Owing to the versatility, it is possible to drive motors, for example stepper or BLDC (brushless DC) motors. Measurement functionalities are realizable in the interface circuit. Thus, autonomous detection of motor types or configurations can take place. By virtue of the configuration unit, it is possible to increase the measurement accuracy within the interface circuit by, for example, calibration or temperature compensation (by software, for example look-up table).

The interface circuit can be used universally. As a result of the versatility and configurability, there is a reduction in the range of devices. The interface circuit can be used universally in various systems. By virtue of the routing function, there is a reduction in and optimization of the cabling, in particular in an aeroplane.

In a preferred embodiment, the interface circuit is embodied as a half-bridge circuit. Said half-bridge circuit has a switching branch which is routed from a first (upper) to a second (lower) supply connection. The switching branch contains, in a series connection:

a first (upper, TOP, high-side) and a second (lower, BOT, low-side) bridge element, which are each configurable by the configuration unit. Depending on the configuration, each of the bridge elements is able to be driven by a logic input or able to be read by a logic output, or otherwise able to be used.

a disconnecting switch, which is arranged between the first and second bridge element and can be switched by the configuration unit, that is to say can be opened or closed;

the first power connection, which is arranged between the first bridge element and the disconnecting switch; and the second power connection, which is arranged between the second bridge element and the disconnecting switch.

By virtue of the realization as half-bridge, the known advantages of half-bridge circuits also emerge for the interface according to the invention when the disconnecting switch is closed (conducting). In particular, a plurality of half-bridges can be combined to form a full-bridge or even more complex circuits. For this purpose, the bridge elements are equipped with a switch function. The two power connections are then directly connected, with the result that two connections are physically available for two power parts. In the case of wiring as digital power input, a "wired OR" functionality emerges here, which is externally physically routed to two connections, however. Thus, in aviation engineering, a permitted wiring can be performed since the wiring of a single connection to two lines is forbidden.

By integration of a disconnecting switch in the "centre" of the half-bridge, the upper (so-called TOP part) can also be completely disconnected from the lower (so-called BOT part) half-bridge part. Thus, two separate circuit parts occur in the interface, which are connected in each case to one of the power connections. Both circuit parts can be driven and used completely separately from one another.

Particularly in this embodiment, the abovementioned switch functionality is possible: by opening or closing the switch, each of the two power connections can either be assigned to the TOP or the BOT part of the half-bridge. In particular, conventional DSO functions can be routed via the switch functionality: for example, a DSO high-side can be available at the low-side power output, or a DSO low-side can be available at the high-side power output.

The bridge elements as switch elements can be used in ON, OFF or PWM operation. In PWM operation, current measurement is also possible in the case of correspondingly equipped bridge elements. By corresponding configuration of the disconnecting switch, current measurement is also possible through the disconnecting switch via the voltage difference between the two power connections.

Therefore, a configurable versatile half-bridge results, which can be used as: DSO high-side and/or DSO low-side, as a switch, for routing of DSO to various power outputs (in the form of "pins"), "wired OR function" for high-side and/or low-side, as isolation switch for high-side or low-side DSO, as motor controller, in particular for stepper, BLDC or brush motors, as DSI with connection to the lower or higher potential of the power supply (for example DSI-GND-OPEN and/or DSI-28 V-OPEN in the case of a 28 V-supply voltage) or as analog input (for example from 0 V to 32 V).

A power connection or TOP or BOT branch of the half-bridge, which connection or branch is not used as "active" power input or output, can be used as "built-in test function" (BIT). By way of example, when one half-bridge part is configured as DSO, the DSI function, which is not used, of the other half-bridge part can be used as monitoring function of the DSO. When one half-bridge part is configured as DSI, the DSO function, which is not used, of the other half-bridge part can be used to generate a stimulus or a test function for the DSI function.

In a preferred variant of this embodiment, each of the bridge elements contains at least one, in particular at least two series-connected, controllable semiconductor switches. By using semiconductor switches, many possibilities of using the electrical main or parasitic properties of said semiconductor switches in a targeted manner by targeted wiring or driving using the configuration unit already present themselves in relation to the invention. Thus, for example, parasitic diodes can be used as measuring elements for currents through the semiconductor switches in question, a current measurement in PWM operation or a configurable current limiting in the switching branch can be realized by driving the semiconductor switch.

In a preferred variant of this embodiment, at least one of the semiconductor switches contains a MOSFET with parasitic substrate diode. In particular, if two MOSFETs are connected in series in a bridge element, one can primarily be used as switch (diode is actually "only" parasitic), the other can primarily be used as controllable diode element (parasitic diode is "configured" in terms of its properties by the semiconductor switch).

Therefore, in a preferred variant of this embodiment, at least one of the semiconductor switches is set up in a manner connected to the configuration unit such that, by virtue of said semiconductor switch being driven, the electrical properties of its parasitic substrate diode as controllable diode are determined in a targeted manner.

Thus, in particular, a test functionality for checking the body diodes of the diode-MOSFET, that is to say testability of the substrate diode by changing the diode configuration voltage, results. The diode can also be used as measuring element for the current through the switch. By configuring the drive of the diode-FET, the latter is to be used as measuring resistor or automatic diode/configurable current measuring element. Two current measuring methods ($R_{DS}$ or $U_{GS}$) are possible per configuration. A shift in measuring ranges or an adaptive measuring range adaptation are possible. Current limiting is possible by virtue of linear operation.

In this case, a MOSFET can replace a conventional diode with nonreactive series resistor. The current through a switch can be measured via the voltage $U_{GS}$ of the switch drive. The current measurement for the switch function is configurable via a regulation of the $U_{GS}$ switch voltage. The diode can be switched as resistor for a motor operation. There is minimal current consumption in the load path. The invention can be used as a device for measuring a load current in the event of low power consumption and optimized MTBF and area.

In another preferred embodiment, the disconnecting switch has two series-connected controllable semiconductor switches. In particular, the semiconductor switches each contain MOSFETs with respective parasitic substrate diodes, wherein the substrate diodes of said MOSFETs are oriented in reverse bias with respect to the series connection. Thus, the abovementioned advantages also emerge for the disconnecting switch.

With respect to the interface module, the problem is solved by an interface module according to patent claim 8. Said interface module contains at least two power connections. The interface module contains at least one interface circuit according to the invention, the power connections of which interface circuit are routed to the power connections of the interface module.

The advantages of the interface circuit thus also emerge for the interface module. In particular, the module is configurable and therefore can be used in any way with the result that the power connections thereof must only be reconfigured and not remain unused when a particular type of power connection is required in a system plane.

In a preferred embodiment, additional power connections in the form of power inputs or outputs are provided in the module, wherein the interface module contains a specific input or output interface for each of these power connections. The power connection is then permanently embodied as input or output and is not reconfigurable as output or input. Specific interfaces such as this are more cost-effective than the universal interface according to the invention. Since a minimum number of dedicated power inputs and outputs are generally required on a system plane anyway, at least these ones can be realized in a cost-effective manner. The remaining interfaces can then be provided in a flexible manner according to the invention.

BRIEF DESCRIPTION OF THE DRAWINGS

Further features, effects and advantages of the invention emerge from the following description of a preferred exemplary embodiment of the invention and from the appended figures, in which:

FIG. 4 shows a table of possible configurations of the half-bridge from FIG. 3, FIG. 5A shows the half-bridge from FIG. 3 when the disconnecting switch is open;

FIG. 5B shows the combination of two half-bridge circuits;

FIG. 5C shows the combination of four half-bridge circuits;

DETAILED DESCRIPTION OF THE INVENTION

Figure 1:
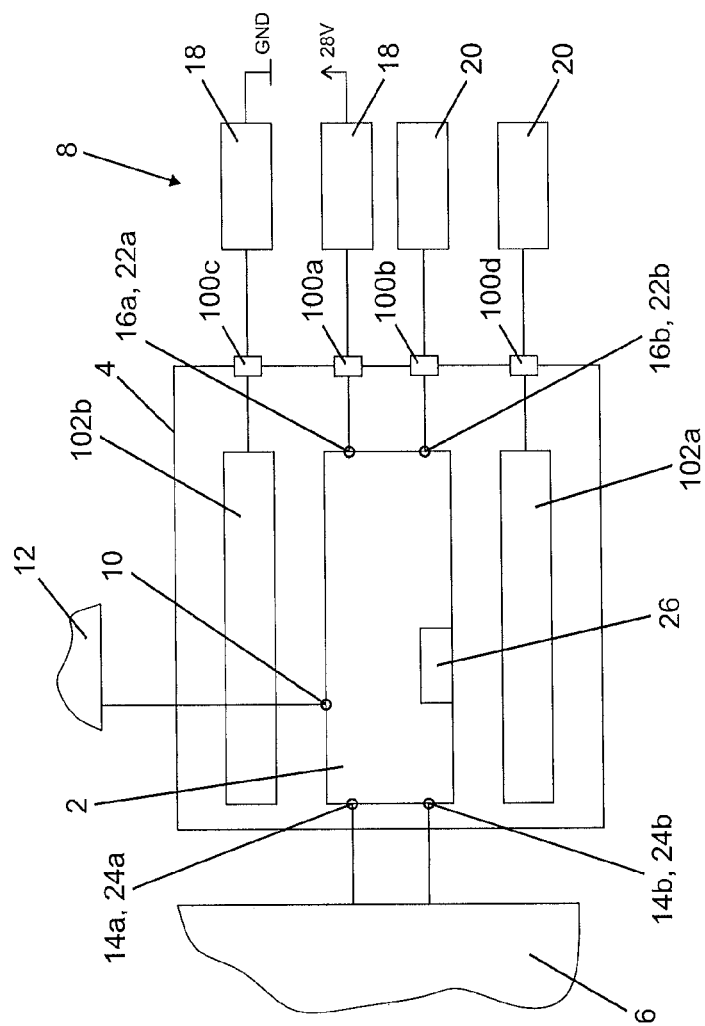
FIG. 1 shows an interface module according to the invention having an interface circuit according to the invention.

FIG. 1 shows an interface circuit 2 according to the invention in an interface module 4, which interface circuit is interconnected between a logic circuit 6 and a power circuit 8. The interface circuit is connected to a power supply 12 via a supply connection 10. Two logic connections 14a,b are used to connect to the logic circuit 6, two power connections 16a,b are used to connect to the power circuit 8 or to a load 18 and a switch 20. Therefore, the power connection 16a is configured as power output 22a and the power connection 16b is configured as power input 22b. The logic connection 14a is configured as logic input 24a for driving the load 18, the logic connection 14b is configured as logic output 24b for reading the switch 20. The configuration is done by the configuration unit 26.

The interface module 4 also has power connections 100a-d. The power connections 16a,b of the interface circuit 2 are routed to the power connections 100a,b of the interface module 4.

The power connections 100c,d are additionally present on the interface module 4. These are a dedicated input module 102a and a dedicated output module 102b. Therefore, the power connection 100c is a power output for driving a load 18 and the power connection 100d is a power input for reading a switch 20, which power connections 100c,d are not reconfigurable as input or output.

Figure 2A:
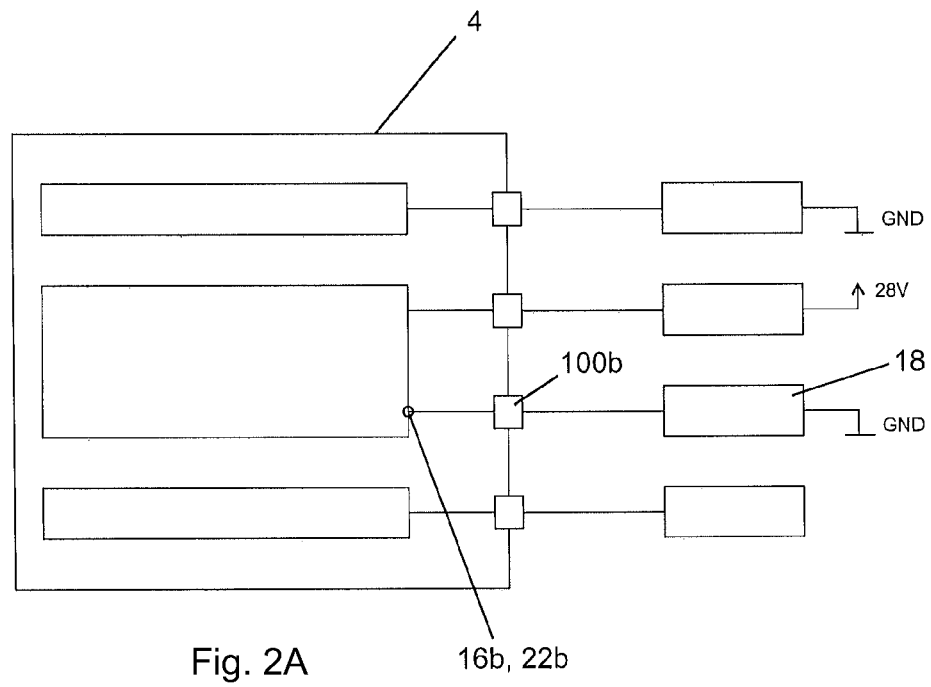
FIG. 2A shows the interface module from FIG. 1 in an alternative configuration and wiring.

FIG. 2a shows the interface module 4 from FIG. 1 in an alternative configuration. Instead of the switch 20, a load 18 is connected to the power connection 100b. The power connection 100b and the power connection 16b are therefore configured as power output 22a.

Figure 2B:
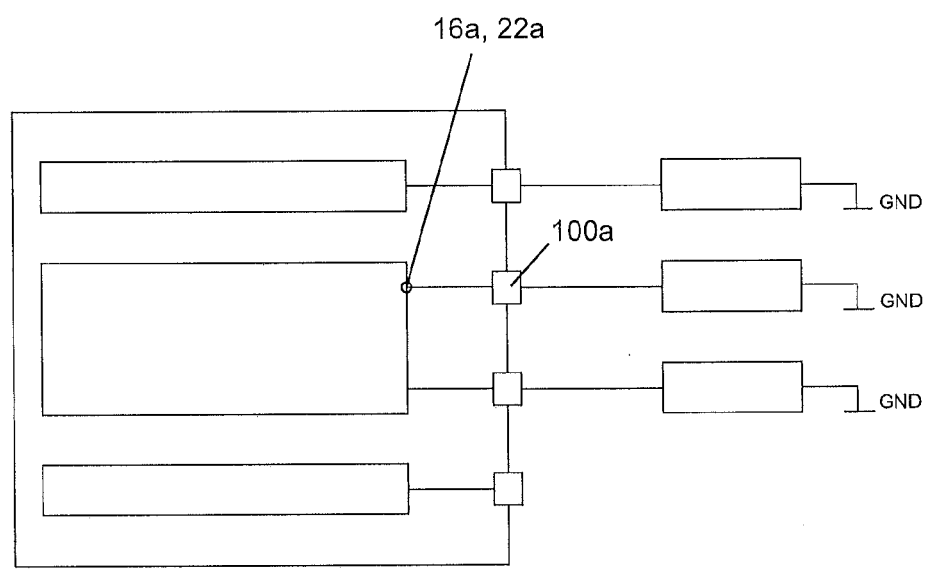
FIG. 2B shows the interface module from FIG. 1 in another alternative configuration and wiring.

FIG. 2b shows another alternative configuration of the interface module 4. In this case, as before, the power connection 16a is configured as power output 22a but it is configured in this case to drive a load with respect to ground (GND) instead of with respect to supply voltage (28V).

Figure 3:
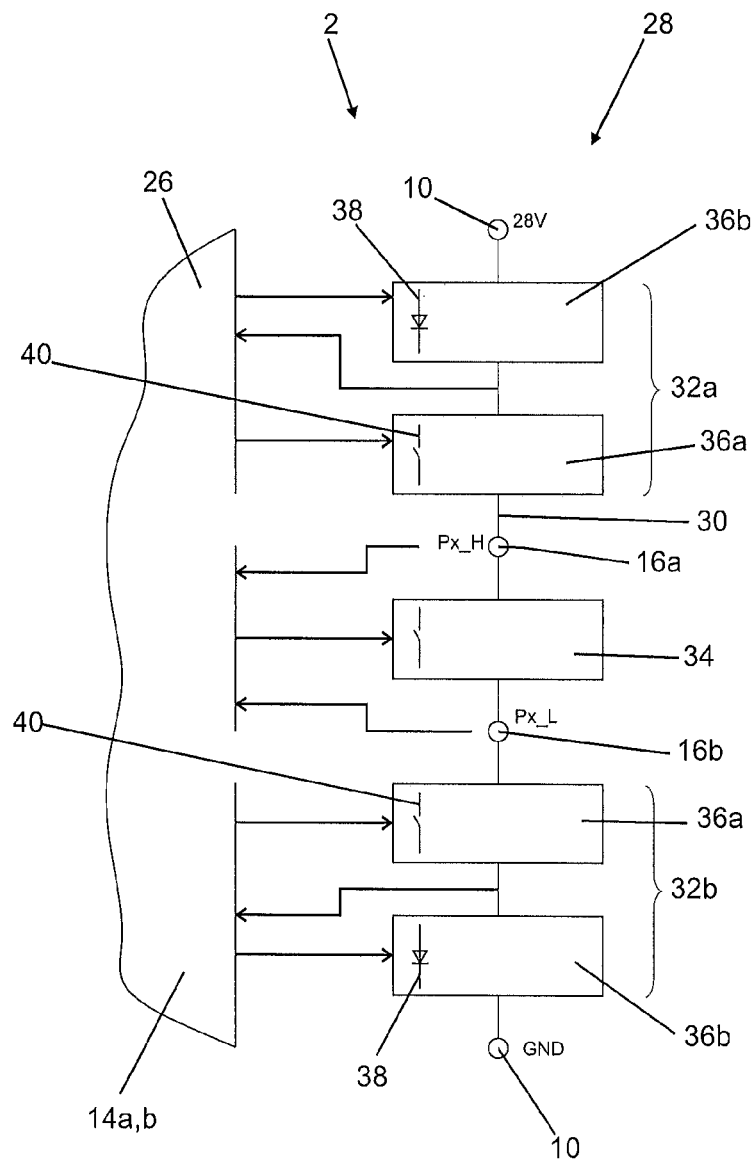
FIG. 3 shows the interface circuit from FIGS. 1 and 2, embodied as half-bridge.

FIG. 3 shows the interface circuit 2 in the form of a half-bridge circuit 28 with a switching branch 30 which is routed from a supply connection 10a connected to the supply voltage 28V to a supply connection 10b connected to ground GND. The switching branch contains a series connection composed of a first bridge element 32a and a second bridge element 32b with a disconnecting switch 34 lying in between. The first power connection 16a is located between the first bridge element 32a and the disconnecting switch 34; the second power connection 16b is located between the second bridge element 32b and the disconnecting switch 34. The bridge elements 32a,b and the disconnecting switch 34 are configurable by the configuration unit 26. The latter also contains or is routed to the logic connections 14a,b, which are not shown in more detail here. The connection lines shown are used for this purpose.

The bridge elements 34a,b are embodied as a series connection of in each case two semiconductor switches 36a,b. The semiconductor switch 36a is actually used as switch 40. The semiconductor switch 36b has a parasitic diode: said semiconductor switch is driven by the configuration unit 26 such that the electrical properties of the diode thereof are used in terms of circuitry. In other words, the semiconductor switch 36b is operated or used as configurable diode 38 and not as an actual switch 40.

In detail, the gate-source voltages $U_{GS}$ of the semiconductor switches in the bridge elements 32a,b are controlled, the switching commands of the disconnecting switch 34 are supplied and the voltages of the line sections of the switching branch 30 are read via the connection lines.

FIG. 4 shows a table 17 of possible configurations of the half-bridge circuit 28 (in this case abbreviated to CVHB: configurable versatile half-bridge) from FIG. 3: a maximum of two conventional interface circuits can be realized per configuration; these are seen in columns from left to right:
  a DSO module for driving a load with respect to positive supply voltage (for example 28 V)
  a DSO module for driving a load with respect to negative supply voltage (for example GND)
  a switch
  a stepper motor drive
  a drive for a brushless DC motor (BLDC)
  a drive for a DC motor with brushes (BDC)
  a DSI module for inputs with respect to positive supply voltage (for example 28 V)
  a DSI module for inputs with respect to negative supply voltage (for example GND)
  an analog input (for example for voltages from 0 to 32 V) to the first power connection 16a
  an analog input (for example for voltages from 0 to 32 V) to the second power connection 16b.

FIGS. 5a-c show in each case identical half-bridge circuits 28 the elements of which, for reasons of clarity, are numbered only once in a manner representative of all. FIG. 5a shows the half-bridge circuit 28 when the disconnecting switch 34 is open. Both the TOP and the BOT part of the half-bridge can be used to drive loads 18 via the two power connections 16a,b.

FIG. 5b shows the combination of two half-bridge circuits 28 for driving a load 18 between the respective power connections 16b, wherein current can be selectively conducted in both directions through the load.

FIG. 5c shows the combination of four half-bridge circuits 28 for driving a stepper motor or a BLDC motor as load 18, in each case connected to the power connections 16b.

Figure 5D:
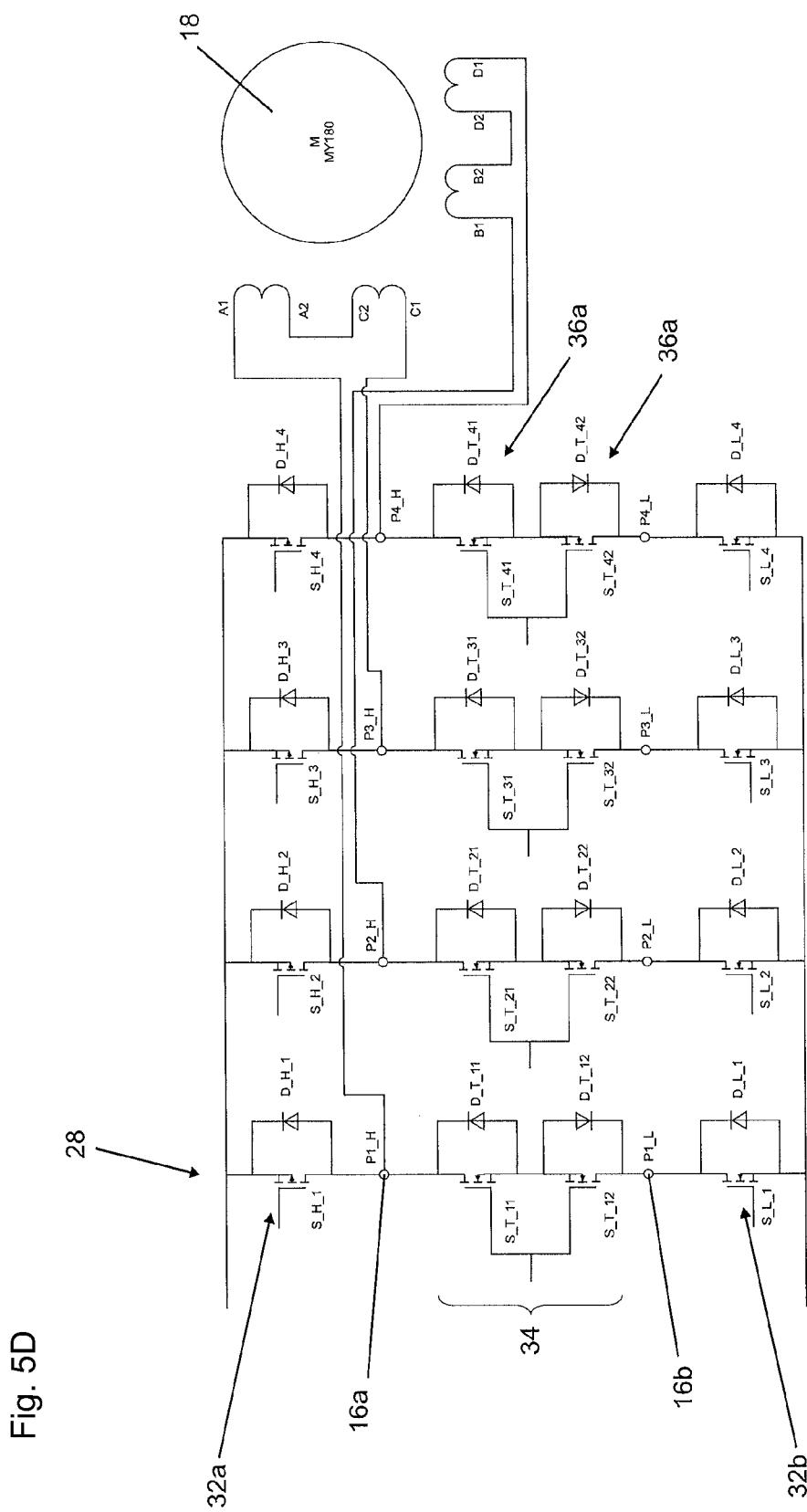
FIG. 5D shows an alternative combination of four half-bridge circuits.

FIG. 5d likewise shows the combination of four identical yet alternative half-bridge circuits 28 for driving a serial bipolar stepper motor as load 18. In this case, the disconnecting switches 34 are embodied specifically as a series connection of two semiconductor switches 36a the parasitic diodes of which are oriented back-to-back in parallel.

Figure 6A:
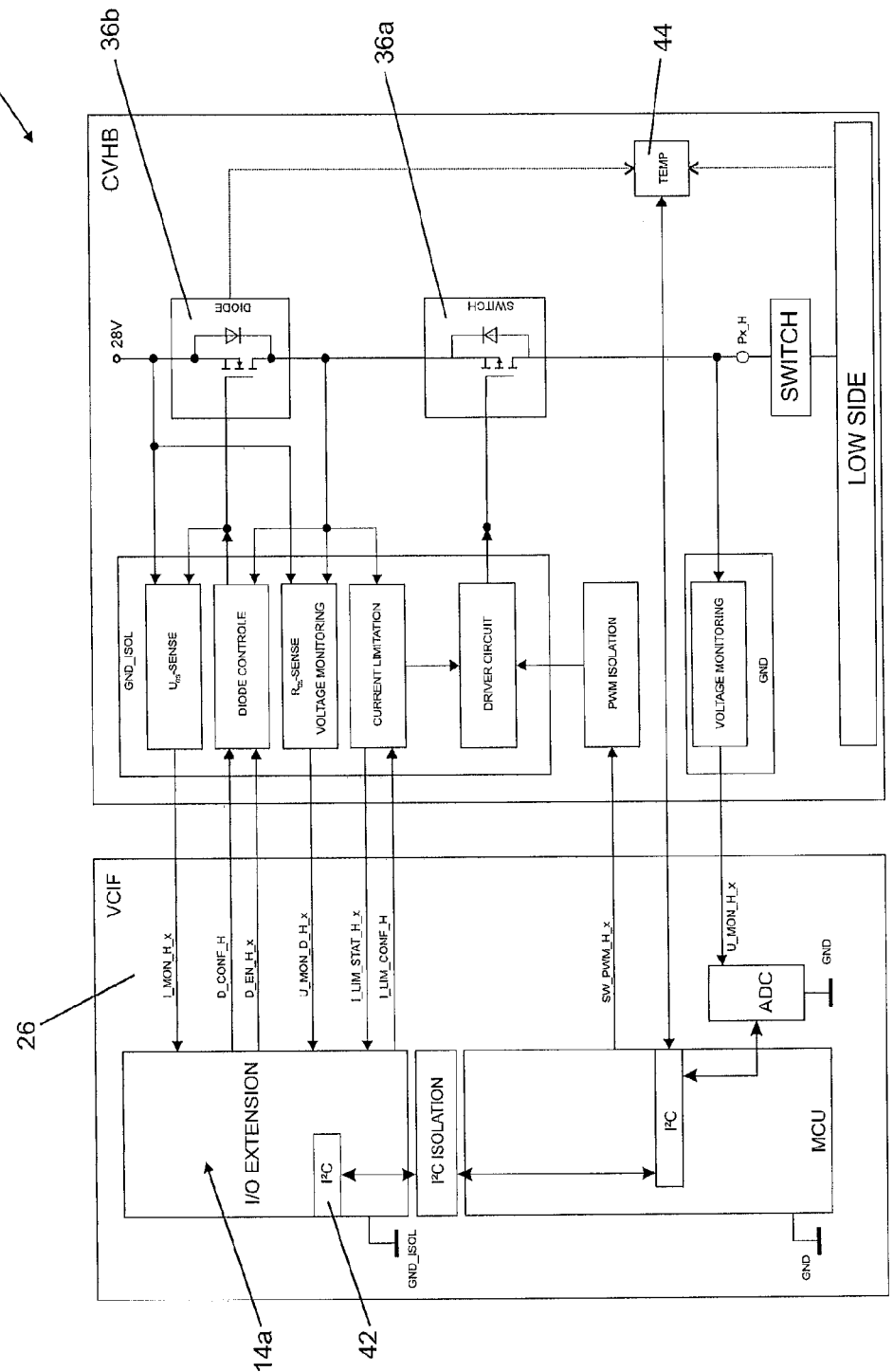
FIG. 6A shows the top part of the half-bridge circuit from FIG. 3 in detail.
Figure 6B:
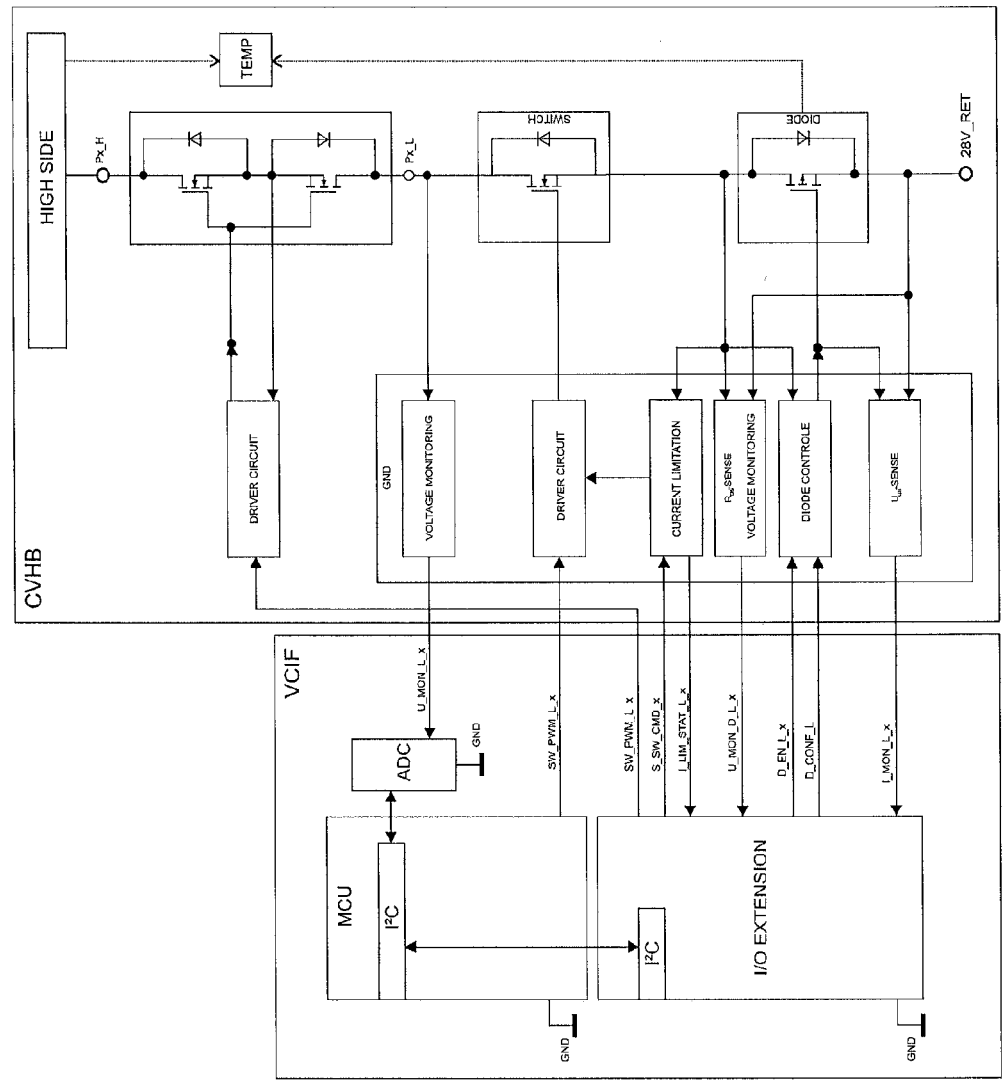
FIG. 6B shows the disconnecting switch of the half-bridge circuit from FIG. 3 in detail.

FIG. 6a shows the TOP part (illustrated in FIG. 6b as place holder "HIGH SIDE") of the half-bridge circuit 28; FIG. 6b shows the disconnecting switch 34 thereof (illustrated in FIG. 6a as place holder "SWITCH") and BOT part (illustrated in FIG. 6a as place holder "LOW SIDE"). The configuration unit 26 is also referred to as VCIF (versatile configuration interface) in this case and contains the logic connections 14a,b in the form of I²C bus connections 42. The references in the figures are self-explanatory and refer, for example, to a temperature sensor 44 "TEMP", a monitoring circuit for monitoring a gate-source voltage "$U_{GS}$ Sense", an analog-to-digital converter 46, a microcontroller unit "MCU", etc.

LIST OF REFERENCE SIGNS 2 interface circuit
4 interface module
6 logic circuit
8 power circuit
10, 10a,b supply connection
12 power supply
14a,b logic connection
16a,b power connection
18 load
20 switch
22a power output
22b power input
24a logic input
24b logic output
26 configuration unit
28 half-bridge circuit
30 switching branch
32a,b bridge element
34 disconnecting switch
36a,b semiconductor switch
38 diode
40 switch
42 I²C bus connection
44 temperature sensor
46 analog-to-digital converter
100a-d power connection
102a input module
102b output module

What is claimed is:

1. An interface circuit for intermediate connection between a logic circuit and a power circuit, having a supply connection for connection to a power supply, wherein the interface circuit contains two logic connections to the respective connection on the logic circuit, which logic connections are configurable as logic input or logic output, and two power connections to the respective connection on the power circuit, which power connections are configurable as power input or power output, and a configuration unit for configuring the logic connections and the power connections, wherein the power input can be read by the logic output and the power output can be driven by the logic input.

2. The interface circuit according to claim 1, which interface circuit is designed as half-bridge circuit, having a switching branch, which is routed from a first to a second supply connection and which contains, in a series connection:

a first and a second bridge element, which are each configurable by the configuration unit in order to be able to be driven by a logic input or to be able to be read by a logic output, a disconnecting switch, which is arranged between the first and second bridge element and can be switched by the configuration unit, the first power connection, which is arranged between the first bridge element and the disconnecting switch, the second power connection, which is arranged between the second bridge element and the disconnecting switch.

3. The interface circuit according to claim 2, wherein each of the bridge elements contains at least one series-connected controllable semiconductor switches.

4. The interface circuit according to claim 3, wherein each of the bridge elements contains at least two series-connected controllable semiconductor switches.

5. The interface circuit according to claim 3, wherein at least one of the semiconductor switches contains a MOSFET with a parasitic substrate diode.

6. The interface circuit according to claim 5, in which at least one of the semiconductor switches is set up in a manner connected to the configuration unit such that, by virtue of said semiconductor switch being driven, the electrical properties of its parasite substrate diode as controllable diode are determined in a targeted manner.

7. The interface circuit according to claim 2, wherein the disconnecting switch contains two series-connected controllable semiconductor switches.

8. The interface circuit according to claim 7, wherein the semiconductor switches in each case contain MOSFETs with respective parasitic substrate diodes, wherein the substrate diodes of said MOSFETs are oriented in reverse bias with respect to the series connection.

9. An interface module, having at least two power connections, wherein the interface module contains at least one interface circuit according to claim 1, the power connections of which interface circuit are routed to the power connections of the interface module.

10. The interface module according to claim 9, having additional power connections, wherein the interface module contains a specific input or output interface for each of the power connections.

* * * * *